(12) United States Patent
Lee et al.

(10) Patent No.: US 10,964,876 B2
(45) Date of Patent: Mar. 30, 2021

(54) INTEGRATED FLEXIBLE THERMOELECTRIC DEVICE AND METHOD OF MANUFACTURING THE SAME

(71) Applicants: Hyundai Motor Company, Seoul (KR); Kia Motors Corporation, Seoul (KR); Kookmin University Industry Academy Cooperation Foundation, Seoul (KR)

(72) Inventors: Eun Yeong Lee, Seoul (KR); Mi Yeon Song, Seoul (KR); Sang Hak Kim, Seoul (KR); Hyun Jung Lee, Seoul (KR); Hyun Woo Bark, Seoul (KR); Young Hoe Kim, Seoul (KR)

(73) Assignees: Hyundai Motor Company, Seoul (KR); Kia Motors Corporation, Seoul (KR); Kookmin University Industry Academy Cooperation Foundation, Seoul (KR)

( * ) Notice: Subject to any disclaimer, the term of this patent is extended or adjusted under 35 U.S.C. 154(b) by 115 days.

(21) Appl. No.: 16/038,941

(22) Filed: Jul. 18, 2018

(65) Prior Publication Data
US 2019/0035994 A1  Jan. 31, 2019

Related U.S. Application Data

(62) Division of application No. 14/943,056, filed on Nov. 17, 2015, now abandoned.

(30) Foreign Application Priority Data

Jul. 14, 2015 (KR) .................. 10-2015-0099789

(51) Int. Cl.
*H01L 35/34* (2006.01)
*H01L 35/24* (2006.01)
*H01L 35/28* (2006.01)

(52) U.S. Cl.
CPC .............. *H01L 35/34* (2013.01); *H01L 35/24* (2013.01); *H01L 35/28* (2013.01)

(58) Field of Classification Search
CPC .......... H01L 35/34; H01L 35/24; H01L 35/28
See application file for complete search history.

(56) References Cited

U.S. PATENT DOCUMENTS

| 5,022,928 A | 6/1991 | Buist |
|---|---|---|
| 8,642,121 B2 | 2/2014 | Dai et al. |

(Continued)

FOREIGN PATENT DOCUMENTS

| CN | 1795568 A | 6/2006 |
|---|---|---|
| CN | 103333621 A | 10/2013 |

(Continued)

OTHER PUBLICATIONS

Yu, et al., "Air-Stable Fabric Thermoelectric Modules Made of N- and P-type Carbon Nanotubes", Energy & Environmental Science, 2012, 5:9481-9486.

(Continued)

*Primary Examiner* — Bethany L Martin
(74) *Attorney, Agent, or Firm* — Mintz Levin Cohn Ferris Glovsky and Popeo, P.C.; Peter F. Corless (57) ABSTRACT

An integrated flexible thermoelectric device includes p-type carbon nanoparticle regions and n-type carbon nanoparticle regions which are alternately and continuously connected to each other. In particular, the p-type carbon nanoparticle regions and the n-type carbon nanoparticle regions are formed on the one carbon nanoparticle paper.

5 Claims, 8 Drawing Sheets

(56) References Cited

U.S. PATENT DOCUMENTS

| | | |
|---|---|---|
| 2007/0086921 A1 | 4/2007 | Visel |
| 2007/0157348 A1* | 7/2007 | Bae ..................... B82Y 30/00 438/99 |
| 2011/0214707 A1 | 9/2011 | Suzuki |
| 2011/0220162 A1 | 9/2011 | Siivola et al. |
| 2013/0312086 A1 | 11/2013 | Hamilton, II et al. |
| 2014/0338715 A1 | 11/2014 | Grunlan |
| 2015/0188017 A1* | 7/2015 | Chen ..................... H01L 35/28 136/223 |

FOREIGN PATENT DOCUMENTS

| | | |
|---|---|---|
| FR | 2 620 573 A1 | 3/1989 |
| GB | 1021486 A | 3/1966 |
| JP | H08-153898 A | 6/1996 |
| JP | 2004186245 A | 7/2004 |
| JP | 2006-086510 A | 3/2006 |
| JP | 2010537410 A | 12/2010 |
| JP | 2013232600 A | 11/2013 |
| KR | 10-2011-0048821 A | 5/2011 |
| KR | 101346568 B1 | 1/2014 |
| KR | 10-2014-0040067 A | 4/2014 |
| KR | 20140103765 A | 8/2014 |
| WO | 2004/105146 A1 | 12/2004 |

OTHER PUBLICATIONS

Duong et al., Carbon nanotube doping mechanism in a salt solution and hygroscopic effect: density functional theory, 2010, American Chemical Society Nano letters, vol. 4, No. 9, pp. 5430-5436.

Bark, H. et al., "Enhanced Thermoelectric Performance of CNT Thin Film p/n Junctions Doped with N-Containing Organic Molecules", Macromolecular Research, vol. 23, No. 9, pp. 795-801 (2015).

Hone, J. et al., "Thermoelectric Power of Single-Walled Carbon Nanotubes", Physical Review Letters, vol. 80, No. 5, pp. 1042-1045 (Feb. 2, 1998).

Hewitt, Corey A., et al., "Multilayered Carbon Nanotube/Polymer Composite Based Thermoelectric Fabrics", Nano Lett. (2012) 12, pp. 1307-1310.

* cited by examiner

INTEGRATED FLEXIBLE THERMOELECTRIC DEVICE AND METHOD OF MANUFACTURING THE SAME

CROSS-REFERENCE TO RELATED APPLICATION

This application is a Divisional Application of U.S. patent application Ser. No. 14/943,056 filed on Nov. 17, 2015 which claims the benefit of priority to Korean Patent Application No. 10-2015-0099789 filed Jul. 14, 2015, in the Korean Intellectual Property Office, the content of which is incorporated herein in its entirety by reference.

TECHNICAL FIELD

The present invention relates to a thermoelectric device and a method of manufacturing the same. The thermoelectric device of the invention may be an integrated and flexible thermoelectric device including a p-type region and an n-type region which may be directly connected to each other without a separate electrode.

BACKGROUND

Thermoelectric conversion means energy conversion between thermal energy and electrical energy. For example, a temperature difference occurs across a thermoelectric material when current is passed through the thermoelectric material (Peltier effect), or vice-versa, electricity occurs when the temperature difference is present across the thermoelectric material (Seebeck effect).

Further, by using the Seebeck effect, heat generated from a computer, an engine part of a vehicle, an industrial plant, or the like may be converted into electrical energy. Thermoelectric power generation using the Seebeck effect may be utilized as a new renewable energy source. As the interest in the development of new energy, recovery of waste energy, protection of environment, or the like, has recently increased, the interest in a thermoelectric device has also increased.

A thermoelectric device according to the related art includes n-type materials and p-type materials, and electrodes are bonded to end portions of the n-type materials and the p-type materials, which are connected to each other through the electrodes. In this case, when bonding the electrodes, pressure is applied mostly at a high temperature.

However, in such process of connecting the n-type materials and the p-type materials using the electrodes, although the electrodes are formed of a material having low specific resistivity, the electrodes may be a factor that increases internal resistance of the thermoelectric device. Even in the case in which the n-type materials and the p-type materials are directly bonded to each other, resistance of a bonded portion may be increased, which may cause the internal resistance of the thermoelectric device to be increased.

Meanwhile, a semiconductor metal material or a ceramic material has been used mostly for the thermoelectric materials with high performance. The above-mentioned materials may have excellent thermoelectric characteristics, however, they may have high density. Therefore, in order to produce a large amount of power, since a large amount of materials is required, mass or weight thereof may be increased. As such, the thermoelectric device using the corresponding material may not be applied to an automobile industry or a mobile industry that requires weight reduction. In addition, since thermoelectric materials based on an inorganic material are limited in terms of deformation of a form thereof and have high brittleness, they are likely to be broken by vibration or impact.

The above information disclosed in this Background section is only for enhancement of understanding of the background of the invention and therefore it may contain information that does not form the prior art that is already known in this country to a person of ordinary skill in the art.

SUMMARY

In preferred aspect, the present invention provides a thermoelectric device that may have a structure capable of implementing miniaturization and lightness, and may minimize internal resistance, to thereby provide an integrated and flexible thermoelectric device.

In one aspect, provided is a thermoelectric device.

According to an exemplary embodiment of the present invention, the thermoelectric device may include: a carbon nanotube paper comprising p-type carbon nanotube regions and n-type carbon nanotube regions. In particular, dopant may be doped on the n-type nanotube regions to allow the dopants of characteristics in opposition to the carbon nanotube paper to be formed on the carbon nanotube paper and the n-type carbon nanotube regions are spaced apart from each other by a predetermined interval and the p-type nanotube regions are undoped regions.

The term "carbon nanotube", as used herein, refers to a material made of carbon which has a cylindrical shape, and the wall of the cylinder or tube is essentially made of carbons. The carbon nanotube may include a single layer wall or multiple layer walls to form the cylindrical shape thereof, and the diameter formed by the walls may range in nanometer scale, for example, of about 0.3 nm to about several hundred nanometers. Meanwhile, the carbon nanotube may have a length that is up a few hundred times of the diameter thereof. The carbon nanotube may have superior thermal conductivity and mechanical and electrical properties, for example, the carbon nanotube by itself may provide an electron hole exhibiting p-type property.

The term "carbon nanotube paper", as used herein, refers to a sheet like film made of at least carbon nanotubes. The carbon nanotube paper may suitably have suitable flexibility, such that the substrate itself or the substrate with the carbon paper can be transformed, folded, or bent when a predetermined pressure or force is applied. In addition, the carbon nanoparticle paper may have a suitable thickness for providing flexibility as well as rigidity, and the thickness may range from about 5 μm to about 100 μm.

Preferably, the dopants may be physically adsorbed on a surface of a carbon nanotube of the carbon nanotube paper to form the n-type carbon nanotube regions.

Further, the p-type carbon nanotube regions and the n-type carbon nanotube regions may be alternately and continuously aligned in a line, or alternately and continuously laminated.

According to an exemplary embodiment of the present invention, the flexible thermoelectric device may comprise: p-type carbon nanoparticle regions and n-type carbon nanoparticle regions which are alternately and continuously connected to each other. In particular, the p-type carbon nanoparticle regions and the n-type carbon nanoparticle regions may be formed on a carbon nanoparticle paper.

The term "carbon nanoparticle paper", as used herein, refers to a sheet-like film made of at least carbon nanoparticles. The carbon nanoparticles may include carbon nanotubes, carbon graphite, graphene, graphene oxide, graphene nanoribbon, carbonblack, carbon nanofiber or mixtures thereof. Thus, like the carbon nanotube papers above, the carbon nanoparticle paper may suitably have flexibility, such that the substrate itself or the substrate with the carbon nanoparticle region can be transformed, folded, or bent when a predetermined pressure or force is applied. In addition, the carbon nanoparticle paper may have a suitable thickness for providing flexibility as well as rigidity, and the thickness may range from about 5 µm to about 100 µm.

The n-type carbon nanoparticle regions may be formed by physically adsorbing n-type dopants on a surface of the carbon nanoparticle of the carbon nanoparticle paper. Preferably, the n-type dopants may include a monomolecular material or a polymer material containing group 5B, group 6B or group 7B atoms including unshared electron pairs and the n-type dopants may include triphenylphosphine (TPP) or polyethyleneimine (PEI).

Further, the p-type carbon nanoparticle regions may be regions in which the n-type dopants are not adsorbed on the carbon nanoparticle paper. Alternatively, the p-type carbon nanoparticle regions may be regions from which the n-type dopants injected into a carbon nanoparticle are removed by sulfuric acid ($H_2SO_4$) or thionyl chloride ($SOCl_2$).

Preferably, the p-type carbon nanoparticle regions and the n-type carbon nanoparticle regions may be alternately and continuously aligned in a line, or alternatively, the p-type carbon nanoparticle regions and the n-type carbon nanoparticle regions may be alternately and continuously laminated.

In another aspect, provided is a method of manufacturing the thermoelectric device as described above.

According to an exemplary embodiment of the present invention, a method of manufacturing an integrated thermoelectric device may comprise: preparing a carbon nanotube emulsion by dispersing a carbon nanotube in a solvent; forming p-type carbon nanotube paper by molding a layer using the carbon nanotube emulsion; and forming n-type regions on the p-type carbon nanotube paper by selectively injecting n-type dopants into the n-type regions which are predetermined regions on the p-type carbon nanotube paper, thereby forming a p+n integrated carbon nanotube ribbon in which p-type regions and n-type regions are alternately and continuously aligned.

The method may further comprise alternately and sequentially laminating the p-type regions and the n-type regions by folding interface portions between the p-type regions and the n-type regions of the p+n integrated carbon nanotube ribbon.

Preferably, when preparing the carbon nanotube emulsion, the carbon nanotube may be dispersed into nanoparticles by adding a powder of the carbon nanotube in the solvent and then performing an ultra sonication. In particular, the solvent may include one or more selected from the group consisting of dimethyl formamide (DMF), water, methyl pyrrolidone (NMP), methanol, ethanol, propanol, and butanol.

Further, when forming of the p-type carbon nanotube regions, the p-type carbon nanotube regions may be manufactured in a form of a paper by performing a vacuum filtration of the carbon nanotube emulsion and then performing a process of molding a layer.

In addition, when forming of the p+n integrated carbon nanotube ribbon, the p-type carbon nanotube regions may be divided into the p-type regions and n-type regions and the n-type dopants may be then physically adsorbed on surfaces of carbon nanotubes of the n-type regions. Preferably, the n-type dopants may be physically adsorbed by injecting an n-type dopant solution into the n-type regions, coating the n-type regions with the n-type dopants, or vacuum-adsorbing the n-type dopants in the n-type regions.

Preferably, the n-type dopant solution may include triphenylphosphine (TPP) dissolved in dimethylsulfoxide (DMSO), or polyethyleneimine (PEI) dissolved in ethanol.

According to an exemplary embodiment of the present invention, the method of manufacturing an integrated thermoelectric device may comprise: forming an n-type carbon nanotube paper by steps comprising dispersing a carbon nanotube in an n-type dopant solution and then molding a layer; and selectively removing the n-type dopants of predetermined regions from the n-type carbon nanotube paper, thereby forming a p+n integrated carbon nanotube ribbon in which p-type regions and n-type regions are alternately and continuously aligned. In particular, the n-type dopant solution may include n-type dopants.

Preferably, the n-type carbon nanotube paper may be formed by steps comprising: preparing a carbon nanotube emulsion by adding a powder of the carbon nanotube in the n-type dopant solution in which triphenylphosphine (TPP) is dissolved in dimethylsulfoxide (DMSO) or polyethyleneimine (PEI) is dissolved in ethanol; and performing an ultrasonication; and molding a layer by steps comprising performing a vacuum filtration for the carbon nanotube emulsion.

Further, when selectively removing of the n-type dopant from the n-type carbon nanotube paper, the n-type dopants doped in the p-type regions may be washed with dimethylsulfoxide (DMSO) or ethanol. In addition, when selectively removing of the n-type dopant from the n-type carbon nanotube paper, a surface treatment for the p-type regions is performed with carbonyl functional group including a carbonyl group function using sulfuric acid ($H_2SO_4$) or thionyl chloride ($SOCl_2$).

Other aspects of the invention are disclosed infra.

BRIEF DESCRIPTION OF THE DRAWINGS

The above and other objects, features and advantages of the present invention will be more apparent from the following detailed description taken in conjunction with the accompanying drawings.

DETAILED DESCRIPTION

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, some exemplary embodiments of the present invention will be described in detail with reference to the illustrative drawings. It is to be noted that in giving reference numerals to components of each of the accompanying drawings, the same components will be denoted by the same reference numerals even though they are shown in different drawings. Further, in describing exemplary embodiments of the present invention, well-known constructions or functions will not be described in detail in the case in which they may unnecessarily obscure the understanding of the present invention.

Figure 1A:
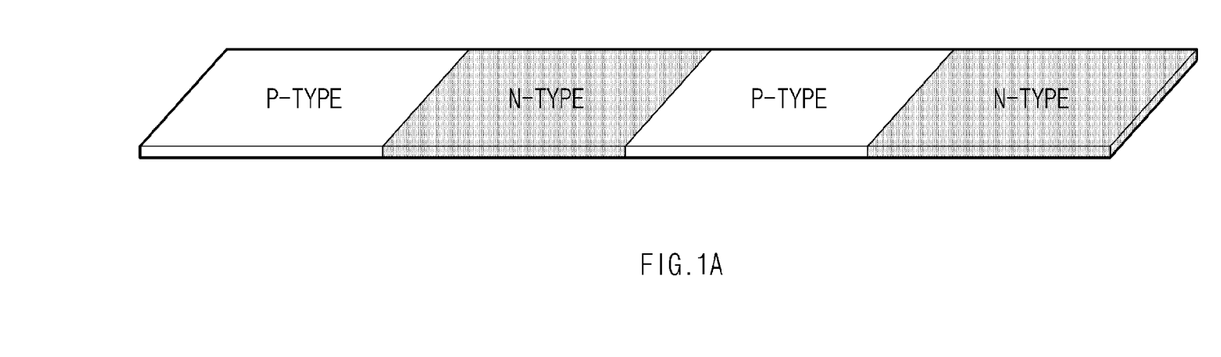
FIG. 1A illustrates an exemplary thermoelectric device that is formed to be flexible and integrating p-type and n-type carbon nanotube regions according to an exemplary embodiment in the present invention.
Figure 1B:
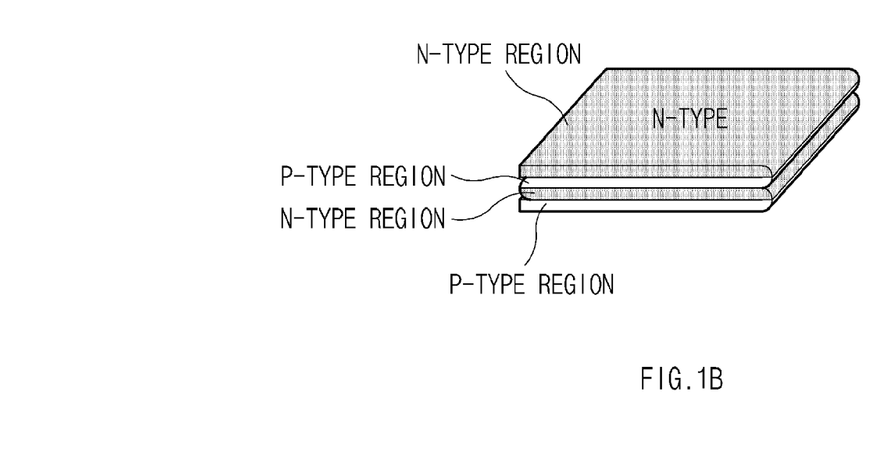
FIG. 1B illustrates a folded state of the thermoelectric device according to an exemplary embodiment in the present invention.

FIGS. 1A and 1B illustrate a structure of an integrated flexible thermoelectric device according to an exemplary embodiment in the present invention. FIG. 1A shows a thermoelectric device is formed in a ribbon form and FIG. 1B shows an exemplary thermoelectric device integrating n-type carbon nanotube regions and p-type carbon nanotube regions in alternate manners.

As used herein, the "p-type" carbon nanotube region may be formed of carbon nanotube materials including electron holes as majority carriers (most abundant electron holes). In certain embodiments, the p-type carbon nanotube region may be doped with an impurity (p-type dopant) to create the electron holes in conductive carbon nanotube materials. In certain embodiments, the carbon nanotubes serve to create the electron holes without the p-type dopants, such that those may be referred to as p-type carbon nanotube regions.

Further, the "n-type" carbon nanotube region may be formed of carbon nanotube materials including free electrons or shared electrons as majority carriers (most abundant free electron donors), and the n-type carbon nanotube region may be doped with an impurity (n-type dopant) to provide greater electron concentration than the normal carbon nanotubes.

Figure 2:
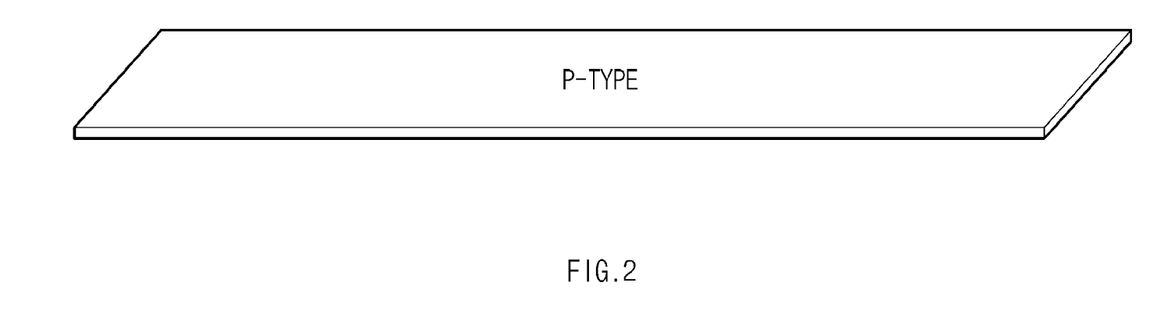
FIG. 2 shows an exemplary p-type carbon nanotube paper in a ribbon form prepared according to an exemplary embodiment of the present invention.
Figure 7:
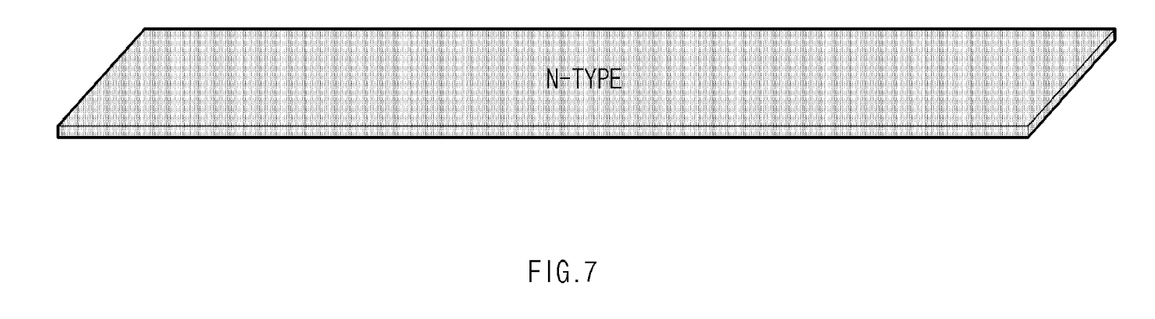
FIG. 7 shows an exemplary n-type carbon nanotube paper in a ribbon form prepared according to an exemplary embodiment of the present invention.

Further, in particular, the above carbon nanoparticle region, for example, either p-type or n-type carbon nanotube regions of FIG. 2 and FIG. 7, respectively, may be formed to be in a paper form and to have suitable flexibility, such that the substrate itself or the substrate with the carbon nanoparticle regions can be transformed, folded, or bent when a predetermined pressure or force is applied. In addition, the carbon nanotube paper may have a suitable thickness for providing flexibility as well as rigidity, and the thickness may range from about 5 μm to about 100 μm.

Referring to FIGS. 1A and 1B, the integrated thermoelectric device according to the present exemplary embodiment may include a structure in which p-type carbon nanotube (CNT) regions and n-type carbon nanotube regions are alternately and continuously connected to each other.

In particular, the p-type carbon nanotube regions and the n-type carbon nanotube regions may be integrally formed. The integrated thermoelectric device according to the present exemplary embodiment may have a structure in which a region having p-type characteristics and a region having n-type characteristics are continuously and alternately formed on one carbon nanotube paper (a paper on which a carbon nanotube network is formed), which is different from a conventional thermoelectric device including an additional electrode or a conductive adhesive to couple the p-type carbon nanotube region and the n-type carbon nanotube region. The above-mentioned integrated structure may be formed by partially doping n-type or p-type dopants on the carbon nanotube paper such that the n-type carbon nanotube region and p-type carbon nanotube region may be connected or positioned continuously and alternately on one carbon nanotube paper. For example, the integrated thermoelectric device may be formed by selectively adsorbing (doping) the n-type dopants on a surface of a p-type carbon nanotube paper of a ribbon form to be spaced apart from each other by a predetermined interval in a length direction and converting the corresponding regions into the n-type carbon nanotube regions. Alternatively, the integrated thermoelectric device may be formed by steps comprising injecting the n-type dopants into the overall p-type carbon nanotube paper in the ribbon form such that those regions may be converted into the n-type carbon nanotube paper and then selectively removing the n-type dopants from the n-type carbon nanotube paper by the predetermined interval in the length direction to recover the corresponding regions into the p-type carbon nanotube regions.

Preferably, the n-type dopants may include a monomolecular material (e.g., triphenylphosphine) or a polymer material (e.g., polyethyleneimine) containing a large amount of group 5B, group 6B or group 7B atoms including unshared electron pairs. As a polymer, a setting polymer or a plastic polymer may be used. For example, as the plastic polymer, any one of polyimide, polyvinylidene (PVDF), nylon, polyethylene terephthalate, polycarbonate, polystyrene, polymethyl methacrylate (PMMA), polyethylene naphthalate (PEN), and polyethersulfone (PES) may be used. Preferably, polyvinylidene (PVDF) may be used, but the examples of the polymers are not limited thereto.

In addition, the n-type dopants may be removed from the n-type carbon nanotube paper by washing the corresponding regions using DMSO or ethanol or performing a surface treatment for the corresponding regions with a carbonyl functional group including carbonyl group such as carboxyl acid, carboxyl halides, or the like using sulfuric acid ($H_2SO_4$) or thionyl chloride ($SOCl_2$) may be used. As described above, the regions where the n-type dopants are removed may have p-type characteristics, and become p-type carbon nanotube regions.

As such, the thermoelectric device according to the various exemplary embodiments of the present invention may be integrally formed so as to include both the p-type characteristics and the n-type characteristics in one carbon nanotube paper, such that internal resistance may be present as that of a pure carbon nanotube between the p-type carbon nanotube region and the n-type carbon nanotube region.

The above-mentioned integrated flexible thermoelectric device may also be formed in the ribbon form in which the p-type carbon nanotube regions and the n-type carbon nanotube regions are alternately and continuously aligned in a line, as illustrated in FIG. 1A. Further, the thermoelectric device may also be formed in the module form in which the p-type carbon nanotube regions and the n-type carbon nanotube regions are alternately and continuously laminated as illustrated in FIG. 1B by folding interface portions between the p-type carbon nanotube regions and the n-type carbon nanotube regions. However, the folding methods may not be particularly limited thereto.

Although the exemplary embodiments of FIGS. 1A and 1B describes the structure in which two p-type carbon nanotube regions and two n-type carbon nanotube regions are alternately and continuously connected to each other, the number of p-type carbon nanotube regions and n-type carbon nanotube regions is not limited thereto.

In addition, the carbon nanotube paper in the exemplary embodiments described above collectively refers to a material layer (structure body) of a film form on which the carbon nanotube network is formed, and as a carbon nanotube, any one of a single wall carbon nanotube, a double-wall carbon nanotube, a multi-wall carbon nanotube, a thin multi-wall carbon nanotube, and a bundle type carbon nanotube may be used.

In addition, although the exemplary embodiments described above representatively describes the carbon nanotube comprising the carbon nanotubes, however, carbon graphite, graphene, graphene oxide, graphene nanoribbon, carbonblack, or carbon nanoparticle such as carbon nanofiber may also be used instead of the carbon nanotubes to form the paper without limitation.

FIGS. 2 to 5 are process diagrams illustrating processes of manufacturing an integrated flexible thermoelectric device according to an exemplary embodiment of the present invention.

First, referring to FIG. 2, the p-type carbon nanotube paper in the ribbon form is manufactured by dispersing the carbon nanoparticle, for example, the carbon nanotube in a solvent to be separated into particles (nanoparticles) and then by a process of molding a layer using the particles.

For example, carbon nanotube emulsion in which the carbon nanotube is separated (dispersed) into the particles (nanoparticles) is manufactured by adding a powder of the single wall carbon nanotube in dimethyl formamide (DMF) at a concentration of about 0.05 mg/ml, and performing ultra sonication using an ultra sonicator for about 30 minutes. Then, the p-type carbon nanotube paper is manufactured by removing residual solvents from the carbon nanotube emulsion through a vacuum filtration at a temperature of about 80° C. and for about 6 hours using a vacuum oven and then by the process of molding the layer. Preferably, the carbon nanotube paper may be manufactured in a buckypaper form having a thin thickness of about 5 to 100 μm and be formed in the ribbon or belt form. For instance, since the carbon nanotube without any treatment has p-type characteristics, the carbon nanotube paper manufactured with the carbon nanotube may behave the p-type carbon nanotube paper.

Preferably, the solvent for dispersing the powder of the carbon nanotube may include, in addition to dimethyl formamide (DMF) described above, water, methyl pyrrolidone (NMP), methanol, ethanol, propanol, butanol and combinations thereof.

Figure 3:
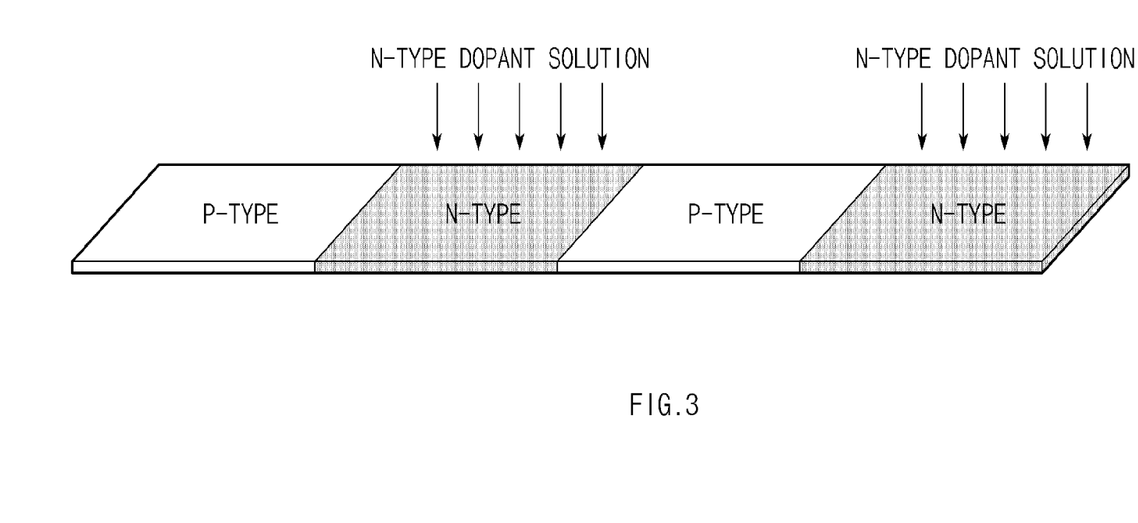
FIG. 3 illustrates an exemplary process of forming n-type carbon nanotube regions on the exemplary p-type carbon nanotube paper of FIG. 2 according to an exemplary embodiment of the present invention.

As shown in FIG. 3, the n-type dopants may be doped on the p-type carbon nanotube paper of the ribbon form to be spaced apart from each other by a predetermined interval, such that a p+n integrated carbon nanotube ribbon in which the p-type carbon nanotube regions and the n-type carbon nanotube regions are alternately and continuously aligned may be formed.

For example, predetermined regions of the p-type carbon nanotube paper may be converted into the n-type carbon nanotube regions by dividing and determining the p-type carbon nanotube paper of the ribbon form into p-type regions and n-type regions; and injecting an n-type dopant solution obtained by dissolving the n-type dopants in the solvent into the n-type regions such that the n-type dopants may be adsorbed (doped) in the n-type regions. Preferably, as the n-type dopant solution, for example, a solution in which triphenylphosphine (TPP) is dissolved in dimethylsulfoxide (DMSO) or a solution in which polyethyleneimine (PEI) is dissolved in ethanol may be used. In addition, the dopants may be physically adsorb the corresponding dopant on the surface of the carbon nanotube with any known methods in the related art. For example, one of a method of immersing the corresponding regions of the carbon nanotube paper in a dopant solution, a method of coating the corresponding regions of the carbon nanotube paper with dopants, and a method of vacuum-adsorbing the dopants on the corresponding regions of the carbon nanotube paper, or a combination thereof may be used.

Figure 6:
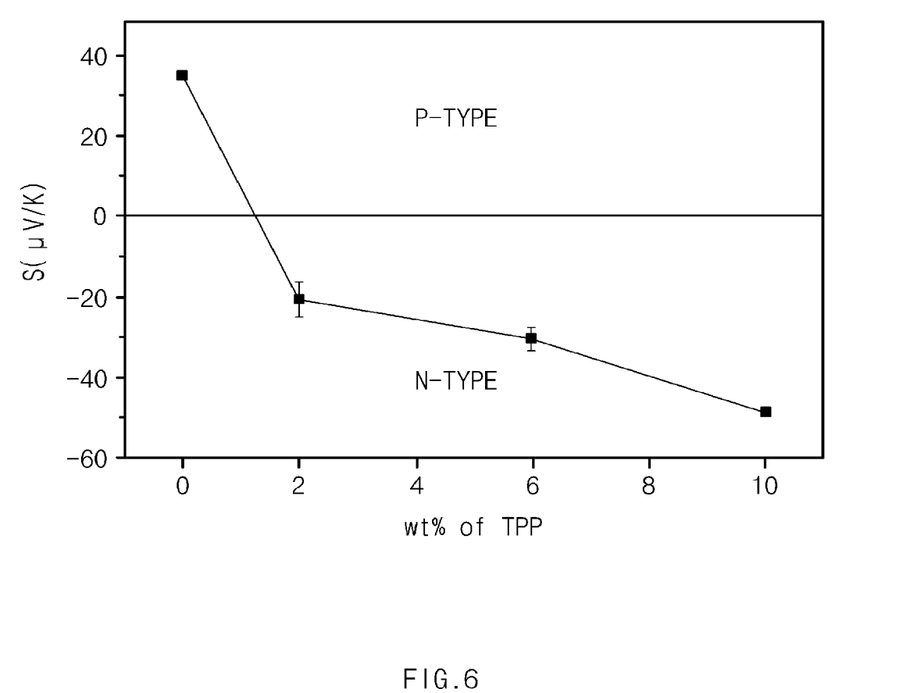
FIG. 6 shows a Seebeck coefficient of an n-type carbon nanotube region according to concentration (wt %) of an n-type dopant solution when the n-type dopant is doped in a p-type carbon nanotube paper according to an exemplary embodiment of the present invention.

FIG. 6 shows a Seebeck coefficient of the n-type carbon nanotube region according to concentration (wt %) of the n-type dopant solution when the n-type dopant solution is dropped in the p-type carbon nanotube paper. As such, the Seebeck coefficient of the n-type carbon nanotube region may be adjusted by adjusting the concentration of the n-type dopant solution.

When the p-type carbon nanotube paper are determined and divided into the p-type regions and the n-type regions, only the n-type regions may be exposed by masking regions intended to be left as a p-type region from the p-type carbon nanotube paper, for example, using TEFLON™ tape, or the like. In this case, the p-type region and the n-type region may have the same areas to each other or may have different areas.

Figure 4:
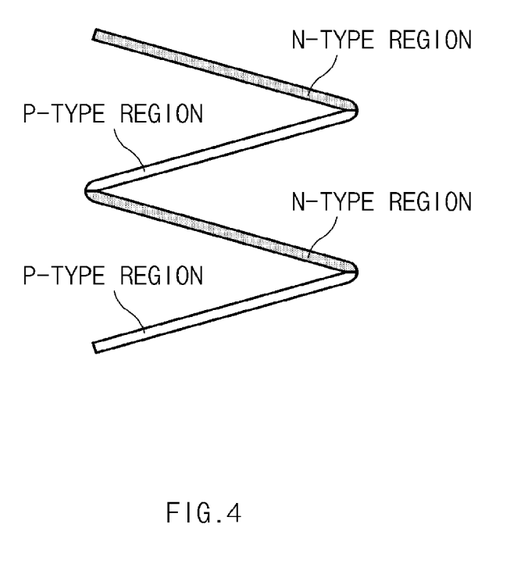
FIG. 4 illustrates an exemplary folding process to form an exemplary thermoelectric device integrating p-type and n-type carbon nanotube regions according to an exemplary embodiment of the present invention.
Figure 5:
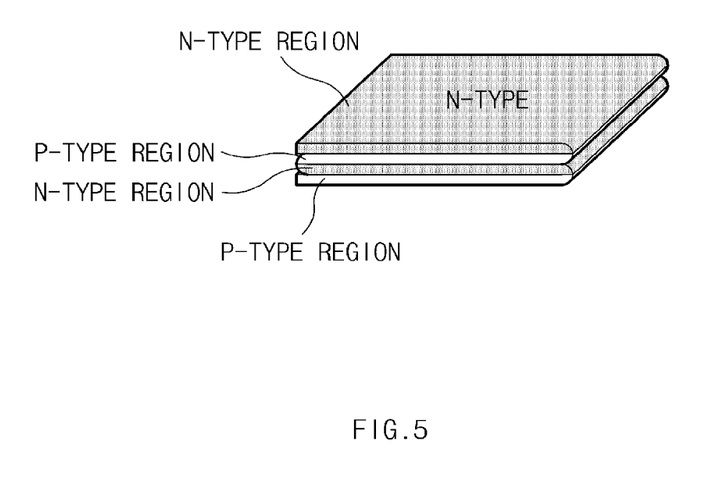
FIG. 5 shows an exemplary an exemplary state of the folded thermoelectric device of FIG. 4 according to an exemplary embodiment of the present invention.

As shown in FIGS. 4 and 5, a laminated module may be formed by folding interface portions between the p-type carbon nanotube regions and the n-type carbon nanotube regions of the p+n integrated carbon nanotube ribbon so that the p-type carbon nanotube regions and the n-type carbon nanotube regions may be alternately laminated.

Figure 8:
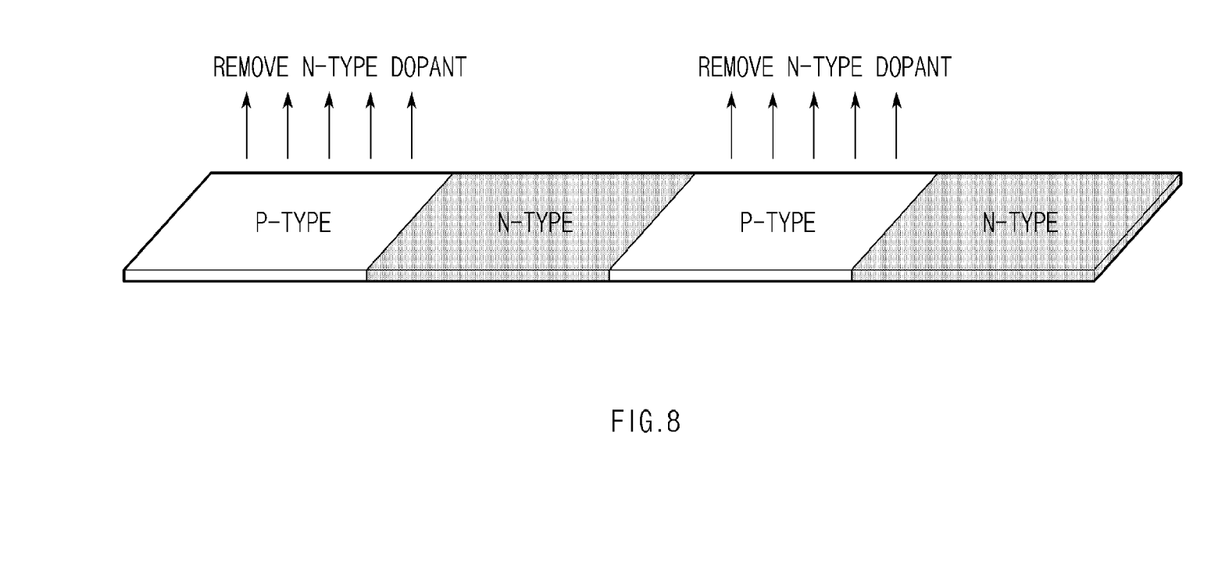
FIG. 8 illustrates an exemplary process of forming p-type carbon nanotube regions on the exemplary n-type carbon nanotube paper of FIG. 7 according to an exemplary embodiment of the present invention

FIGS. 7 and 8 illustrate exemplary processes of manufacturing an integrated flexible thermoelectric device according to an exemplary embodiment of the present invention.

As shown in FIG. 7, an n-type carbon nanotube paper of the ribbon form may be manufactured by dispersing the carbon nanoparticle, for example, the carbon nanotube dispersed in the solution including n-type dopants and separated into particles (nanoparticles) may be molded in a layer using the particles.

For example, a carbon nanotube emulsion is manufactured by adding a powder of a single wall carbon nanotube in a solution in which triphenylphosphine (TPP) is dissolved in dimethylsulfoxide (DMSO) or a solution in which polyethyleneimine (PEI) is dissolved in ethanol and then by an ultra sonication as illustrated in FIG. 2, and the n-type carbon nanotube paper is manufactured by removing residual solvents of the carbon nanotube emulsion by a vacuum filtration and then performing a process of molding a layer. Without limitation, the processes as that illustrated in FIG. 2 described above may be performed suitably except that the n-type carbon nanotube emulsion is formed by separating (dispersing) the powder of the carbon nanotube using the n-type dopant solution.

As shown in FIG. 8, the n-type dopants may be removed from the n-type carbon nanotube paper to be spaced apart from each other by a predetermined interval to recover the corresponding regions to the p-type regions, such that a p+n integrated carbon nanotube ribbon in which the p-type carbon nanotube regions and the n-type carbon nanotube regions are alternately and continuously aligned may be formed.

For example, regions to be recovered to the p-type regions may be determined in the n-type carbon nanotube paper of the ribbon form and the corresponding regions are then washed by using DMSO or ethanol, such that n-type dopants (TPP or PEI) of the corresponding regions may be removed. Alternatively, the surface for the corresponding regions may be treated with a carbonyl functional group including a carbonyl group such as carboxyl acid, carboxyl halides, or the like using sulfuric acid ($H_2SO_4$) or thionyl chloride ($SOCl_2$) may be used. For example, the p-type regions and the n-type regions may be determined or identified by masking the n-type regions using Teflon tape, or the like so that only the regions to be recovered to the p-type regions from the n-type carbon nanotube paper are exposed.

Thereafter, as in FIGS. 4 and 5 described above, a laminated module may be formed by folding the p+n integrated carbon nanotube ribbon.

The spirit of the present invention has been just exemplified. It will be appreciated by those skilled in the art that various modifications and alterations can be made without departing from the essential characteristics of the present invention.

As described above, according to various exemplary embodiments of the present invention, the internal resistance of the thermoelectric device may be minimized, thereby increasing an amount of power generated from the thermoelectric device.

In addition, according to the present invention, miniaturization and weight reduction of the thermoelectric device may be implemented, such that the thermoelectric device may be applied to various fields.

Accordingly, the exemplary embodiments disclosed in the present invention do not limit but describe the spirit of the present invention, and the scope of the present invention is not limited by the exemplary embodiments. The scope of the present invention should be interpreted by the following claims and it should be interpreted that all spirits equivalent to the following claims fall within the scope of the present invention.

What is claimed is:

1. A method of manufacturing an integrated flexible thermoelectric device, the method comprising:
    forming a p-type carbon nanotube,
    forming an n-type carbon nanotube paper by steps comprising (i) dispersing the p-type carbon nanotube in an n-type dopant solution; and (ii) molding the dispersed carbon nanotube into the paper, wherein the n-type dopant solution comprises n-type dopants; and
    selectively removing the n-type dopants of predetermined regions from the n-type carbon nanotube paper, thereby forming a p+n integrated carbon nanotube ribbon in which p-type regions and n-type regions are alternately and continuously aligned.

2. The method according to claim 1, wherein
    the n-type dopant solution comprises triphenylphosphine (TPP) dissolved in dimethylsulfoxide (DMSO) or polyethyleneimine (PEI) dissolved in ethanol.

3. The method according to claim 1, wherein when selectively removing of the n-type dopants of the predetermined regions from the n-type carbon nanotube paper, the n-type dopants of the predetermined regions are washed with dimethylsulfoxide (DMSO) or ethanol.

4. The method according to claim 1, further comprising a surface treatment for the p-type regions is performed with carbonyl functional group including a carbonyl group function using sulfuric acid ($H_2SO_4$) or thionyl chloride ($SOCl_2$).

5. The method according claim 1, wherein the molding is performed by vacuum filtration.

* * * * *